(12) United States Patent
Hekmatshoartabari et al.

(10) Patent No.: US 9,373,691 B2
(45) Date of Patent: Jun. 21, 2016

(54) TRANSISTOR WITH BONDED GATE DIELECTRIC

(71) Applicant: GLOBALFOUNDRIES INC., Grand Cayman (KY)

(72) Inventors: Bahman Hekmatshoartabari, White Plains, NY (US); Ali Khakifirooz, Mountain View, CA (US); Ghavam G. Shahidi, Pound Ridge, NY (US); Davood Shahrjerdi, White Plains, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 13/961,282

(22) Filed: Aug. 7, 2013

(65) Prior Publication Data
US 2015/0041824 A1    Feb. 12, 2015

(51) Int. Cl.
| H01L 29/66 | (2006.01) |
| H01L 29/40 | (2006.01) |
| H01L 29/49 | (2006.01) |
| H01L 29/51 | (2006.01) |
| H01L 21/04 | (2006.01) |
| H01L 29/78 | (2006.01) |
| H01L 29/16 | (2006.01) |
| H01L 21/762 | (2006.01) |

(52) U.S. Cl.
CPC ........ *H01L 29/66068* (2013.01); *H01L 21/049* (2013.01); *H01L 21/76254* (2013.01); *H01L 29/1608* (2013.01); *H01L 29/401* (2013.01); *H01L 29/4916* (2013.01); *H01L 29/513* (2013.01); *H01L 29/78* (2013.01); *H01L 29/518* (2013.01)

(58) Field of Classification Search
CPC ............................. H01L 29/1608; H01L 29/78
USPC .......................................................... 438/459
See application file for complete search history.

(56) References Cited

U.S. PATENT DOCUMENTS

| 5,877,516 A | 3/1999 | Mermagen et al. |
| 6,246,076 B1 | 6/2001 | Lipkin et al. |
| 7,122,488 B2 | 10/2006 | Joshi et al. |

(Continued)

FOREIGN PATENT DOCUMENTS

| CN | 101620990 A | 1/2010 |
| CN | 102244108 A | 11/2011 |

(Continued)

OTHER PUBLICATIONS

Hekmatshoartabari, B., et al. "Transistor With Bonded Gate Dielectric" Office Action Mailed for U.S. Appl. No. 14/020,430 mailed on Jun. 4, 2014 (10 Pages).

(Continued)

*Primary Examiner* — Kevin Parendo
(74) *Attorney, Agent, or Firm* — Anthony Canale; Hoffman Warnick LLC

(57) ABSTRACT

A method for forming a semiconductor device includes forming a dielectric layer on a first substrate and wafer bonding the dielectric layer of the first substrate to a second substrate including SiC with a passivating layer formed on the SiC. A portion of the first substrate is removed from a side opposite the dielectric layer. The dielectric layer is patterned to form a gate dielectric for a field effect transistor formed on the second substrate.

17 Claims, 7 Drawing Sheets

(56) References Cited

U.S. PATENT DOCUMENTS

| | | |
|---|---|---|
| 7,560,361 B2 | 7/2009 | Frank et al. |
| 7,622,763 B2 | 11/2009 | Suda et al. |
| 7,888,256 B2 | 2/2011 | Abagnale et al. |
| 7,919,392 B2 | 4/2011 | Takafuji et al. |
| 8,080,826 B1* | 12/2011 | Johnson et al. ............ 257/77 |
| 8,183,573 B2 | 5/2012 | Abagnale et al. |
| 2002/0045307 A1* | 4/2002 | Kittl et al. ............ 438/226 |
| 2003/0073270 A1 | 4/2003 | Hisada et al. |
| 2005/0032283 A1* | 2/2005 | Itoga et al. ............ 438/149 |
| 2008/0242040 A1 | 10/2008 | Wirbeleit et al. |
| 2009/0072243 A1* | 3/2009 | Suda et al. ............ 257/77 |
| 2010/0117146 A1 | 5/2010 | Ikeda et al. |
| 2010/0184260 A1 | 7/2010 | Luo et al. |
| 2011/0012131 A1* | 1/2011 | Yamazaki ............ 257/77 |
| 2012/0211768 A1 | 8/2012 | Yoshikawa |
| 2013/0168768 A1 | 7/2013 | Takada |
| 2013/0252400 A1* | 9/2013 | Horii ............ 438/458 |

FOREIGN PATENT DOCUMENTS

| | | |
|---|---|---|
| JP | 2012151400 A | 8/2012 |
| WO | WO2008083068 A1 | 7/2008 |

OTHER PUBLICATIONS

Final Office Action for U.S. Appl. No. 14/020,430 mailed on Oct. 7, 2014 (12 Pages).

* cited by examiner

TRANSISTOR WITH BONDED GATE DIELECTRIC

BACKGROUND

1. Technical Field

The present invention relates to semiconductor devices and processing, and more particularly to transistor structures employing a SiC channel layer and a bonded gate structure.

2. Description of the Related Art

SiC is used extensively for high voltage applications. However, formation of a thick gate stack on SiC for high-voltage applications is challenging. SiC oxidation is a very long and high temperature process and leads to the segregation of the carbon atoms in the channel. Typical interface trap density ($D_{it}$) or fixed charge numbers for oxide formed on SiC is in $1 \times 10^{12}$ cm$^{-2}$ range, nearly two orders of magnitude higher than thermal oxide on Si. For high-voltage applications, the gate dielectric should be sufficiently thick to sustain large vertical electric fields. Furthermore, the presence of positive fixed charge leads to reliability issues such as threshold voltage instability under electrical or thermal stress. This therefore hinders the feasibility of thick high-k dielectrics for high-voltage SiC transistors.

SUMMARY

A method for forming a semiconductor device includes forming a dielectric layer on a first substrate and wafer bonding the dielectric layer of the first substrate to a second substrate including SiC with a passivating layer formed on the SiC. A portion of the first substrate is removed from a side opposite the dielectric layer. The dielectric layer is patterned to form a gate dielectric for a field effect transistor formed on the second substrate.

Another method for forming a semiconductor device includes thermally growing a first dielectric layer on a first substrate, the first substrate including monocrystalline silicon; implanting dopant species into the first substrate to form a defect line; growing a dielectric passivating layer on a second substrate formed from SiC; wafer bonding the first dielectric layer of the first substrate to the passivating layer of the second substrate; removing at least a portion of the first substrate from a side opposite the first dielectric layer along the defect line; and patterning the dielectric layer to form a gate dielectric for a field effect transistor formed on the second substrate.

A semiconductor device includes a SiC substrate and a thermally grown dielectric formed on a silicon layer and wafer bonded to the SiC such that the thermally grown dielectric forms a gate dielectric. A gate conductor is provided on the gate dielectric, and source and drain regions are formed in the SiC substrate adjacent to the gate dielectric.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
FIG. 1 is a cross-sectional view of a SiC substrate in accordance with the present principles.

In accordance with the present principles, SiC devices are implemented using a wafer bonding process to transfer a thermal silicon oxide layer formed on Si wafers onto a SiC wafer. In one embodiment, the SiC wafer has a thin thermal oxide, or a thin high-k layer or a combination of thereof on a top interface or surface. In a particularly useful embodiment, a portion of the Si layer from a donor wafer can act as a gate electrode. Alternatively, Si from the donor wafer may be completely removed and a desired gate electrode may be deposited. In yet another embodiment, source and drain regions in the SiC wafer are formed before wafer bonding, so after the gate stack formation, no high temperature process is needed.

It is to be understood that the present invention will be described in terms of a given illustrative architecture having a SiC wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In accordance with the present principles, a design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a substrate or wafer 10 is provided, which is preferably formed from a monocrystalline material or multi-crystalline material. The substrate 10 will be described herein as a SiC substrate; however, other substrate materials may be employed. In particularly useful embodiments, the substrate 10 may be difficult to process and, in particular, may be difficult to form a natural dielectric layer thereon. The substrate 10 may be processed or formed with an active layer or appropriately doped for transistor device (or other device) formation.

Figure 2:
FIG. 2 is a cross-sectional view of the SiC substrate of FIG. 1 having a thin dielectric layer formed thereon in accordance with the present principles.

Referring to FIG. 2, a passivating layer 12 is preferably formed on the substrate 10. The passivating layer 12 may include a thin dielectric layer, such as oxide or oxynitride. The passivating layer 12 may be naturally occurring or may be formed by heating the substrate 10 in the presence of a gas (e.g., $O_2$, $N_2$, etc.) or other process to form the layer 12. The passivating layer 12 may be about 2-10 nm in thickness although other dimensions may be employed. The passivating layer 12 protects the substrate 10 during subsequent processing and further enhances the formation of a bonding interface in later steps. The passivating layer 12 preferably includes a thermally grown oxide or oxynitride. Since the substrate 10 preferably includes SiC, it is difficult to form an oxide thick enough to be adequate for a gate dielectric in a high-voltage device.

Figure 3:
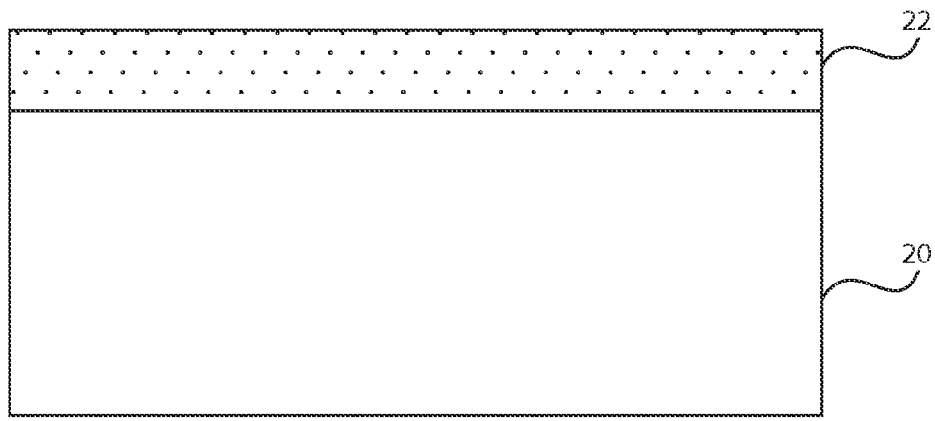
FIG. 3 is a cross-sectional view of another substrate (e.g., Si) having a thick thermally grown dielectric layer formed thereon in accordance with the present principles.

Referring to FIG. 3, a transfer substrate 20 is provided. The transfer substrate 20 may be preprocessed to form active regions (doping, etc.). In one embodiment, the transfer substrate 20 includes Si or at least a Si layer. The substrate 20 may include a bulk Si substrate, a silicon-on-insulator substrate, SiGe, or any other substrate where an oxide or other dielectric material is easily grown and include dielectric properties suitable for use as a gate dielectric or the like. In a particularly useful embodiment, the substrate 20 includes a silicon layer, and a dielectric layer 22 is formed thereon. The dielectric layer 22 may be deposited or thermally grown. If employed as a gate dielectric 22, the dielectric layer 22 is preferably thermally grown. The dielectric layer 22 may include a $SiO_2$ layer having a thickness between about 50 nm to about 500 nm. Other dielectric materials and additional dielectric layers may also be employed.

Figure 4:
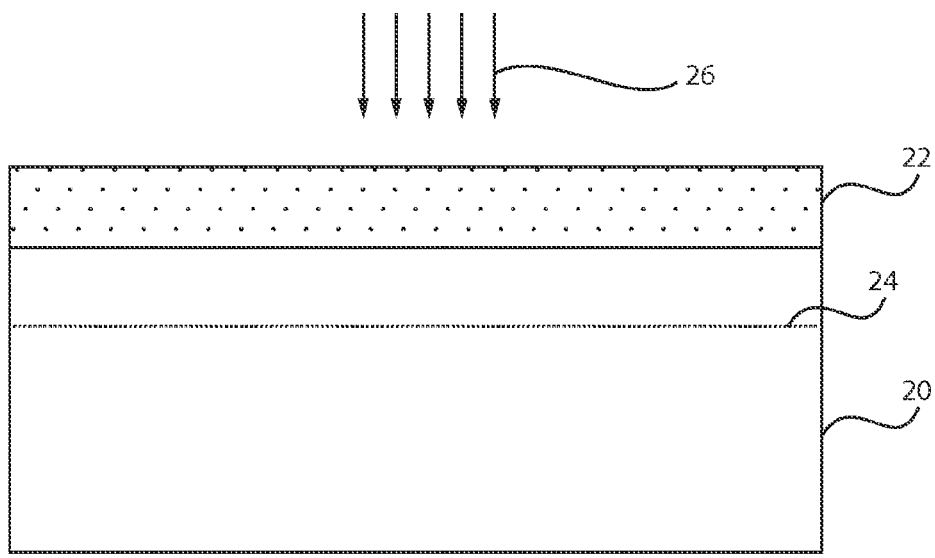
FIG. 4 is a cross-sectional view of the substrate of FIG. 3 showing the formation of a defect line in accordance with one embodiment.

Referring to FIG. 4, the substrate 20 may be further processed to prepare the substrate 20 for splitting or etching. In one embodiment, a defect region or line 24 is created using, for example, the smart cut process. This may include conducting an implanting process where inert gas molecules or ions 26 are implanted through the dielectric layer 22 using an ion implantation technique. In one embodiment, the inert gas may include He or Ar, in another embodiment H ions may be employed. The implantation process is conducted at a power that provides a predetermined defect line to enable spalling, smart cutting or other mechanical cleaving of the substrate 20 along the defect line 24. While spalling or smart cutting are described, the substrate may be processed by altering the etch selectivity of the substrate 20 above the defect line 24. In this embodiment, a dopant or ion species may be implanted in a region (e.g., above the defect line 24, to change the etch properties of the substrate 20, making the region of the substrate 20 closer to the dielectric layer 22 more etch resistant.

Figure 5:
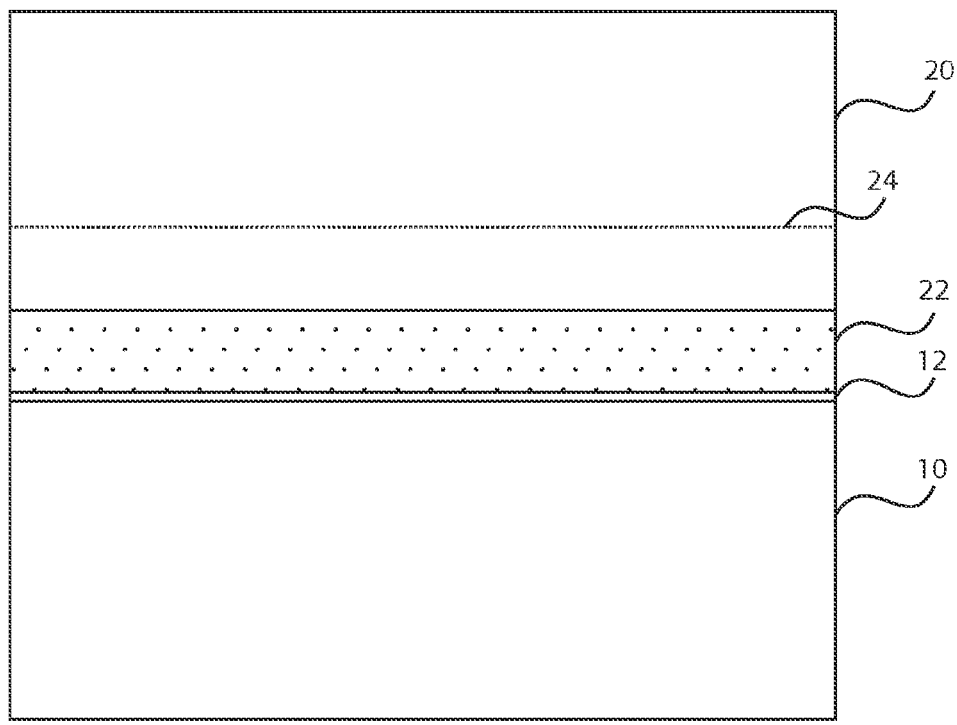
FIG. 5 is a cross-sectional view showing the substrate of FIG. 4 wafer bonded or transfer bonded to the substrate of FIG. 2 in accordance with one embodiment.

Referring to FIG. 5, a wafer bonding process is performed. The substrate 10 with passivating layer 12 is contacted with dielectric layer 22, which is formed on the substrate 20. The dielectric layers 12 and 22 preferably include a compatible material that permits bonding (e.g., oxide bonding) when brought in contact and pressure, heat, etc. is applied.

Figure 6:
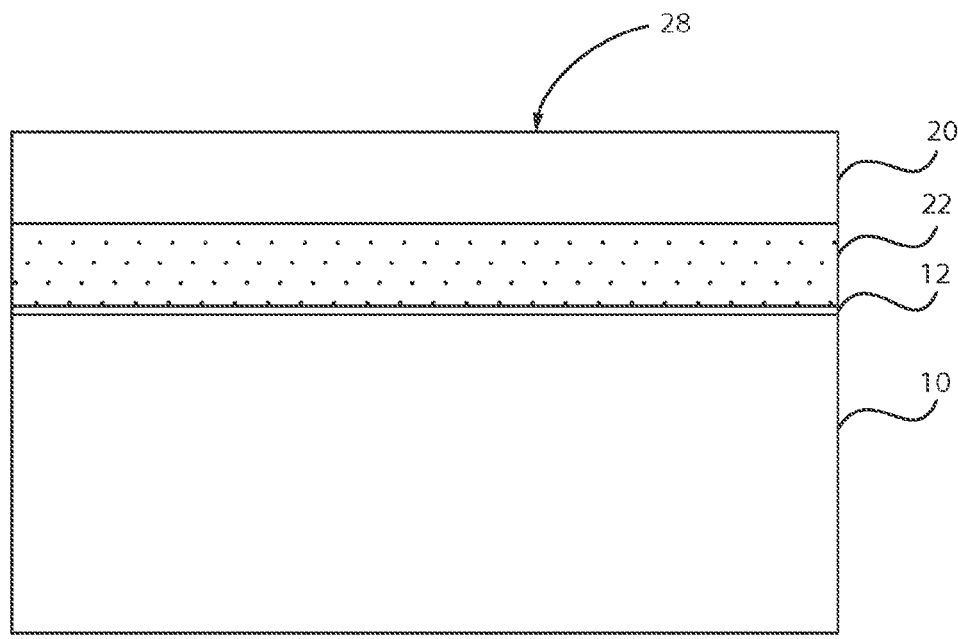
FIG. 6 is a cross-sectional view showing the substrate of FIG. 5 after reducing the substrate coupled to the thermally grown dielectric layer in accordance with one embodiment.

Referring to FIG. 6, the substrate 20 is reduced by employing a smart cut, spalling or other mechanical process, such as cleaving or grinding. In other embodiments, an etch process or planarizing process (e.g., chemical mechanical polishing (CMP)) may be employed to etch down the substrate 20 to surface 28. In one embodiment, where a silicon on insulator substrate is employed for substrate 20, a buried insulator layer may be etched away to release a handle or base substrate, leaving a thin semiconductor layer of the SOI substrate or wafer. Other processes or combinations of processes may be employed to reduce the substrate 20.

Figure 7:
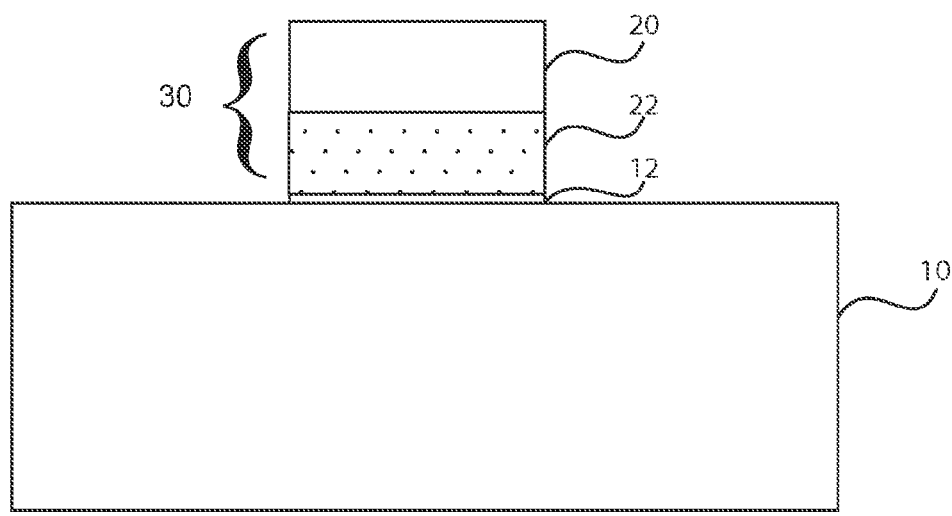
FIG. 7 is a cross-sectional view showing the device of FIG. 6 being patterned to form a gate stack having a gate conductor (e.g., crystalline Si) and a gate dielectric (e.g., thermally grown oxide) in accordance with one embodiment.

Referring to FIG. 7, in one embodiment, the substrate 20 may be doped to increase conductivity and may then be employed as a gate conductor. The doping may be performed before or after patterning the substrate 20, and dielectric layers 22 and 12. The patterning process may include the formation of a hard mask or resist (not shown) in the shape of a gate stack 30 or other components, and etching the substrate 20, and dielectric layers 22 and 12 in accordance with the pattern. The pattern may form the gate conductor and/or other components (e.g., doped regions for transistors, etc.) that may be formed from the remaining portions of the substrate 20 on a periphery or in other areas.

Figure 8:
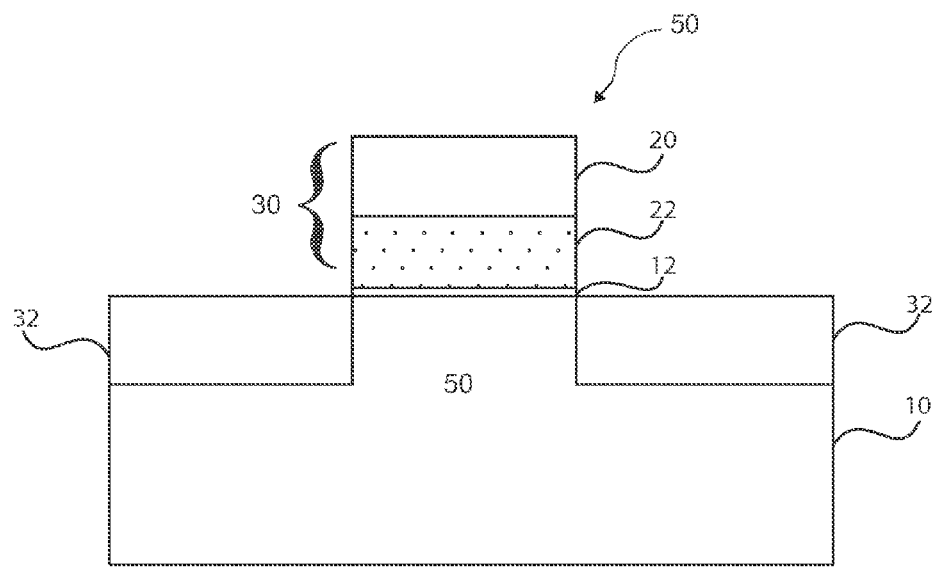
FIG. 8 is a cross-sectional view showing the device of FIG. 7 having source and drain regions formed adjacent to the gate stack in accordance with one embodiment.

Referring to FIG. 8, following the formation of the gate stack 30, source and drain (S/D) regions 32 may be formed by implanting dopants into the substrate 10. Dopants may also be concurrently implanted in the substrate 20 to provide or enhance the gate conductor or other components. A field effect transistor (FET) 50 is formed. In one embodiment, the FET 50 may include a SiC substrate 10 and a thin thermally grown dielectric 22 on the SiC substrate 20. The dielectric layer 22 may include $SiO_2$ employed as a gate dielectric. The $SiO_2$ and the SiC substrate permit high power FET applications. A single crystal Si substrate 20 may be provided as a gate conductor on top of the $SiO_2$ layer 22. The FET fabrication continues with additional processing, e.g., interlevel dielectric layer formation, contact and metallization formation, etc. Additional circuitry may be provided on the thin Si layer 20 and employed with the power FET 50.

Figure 9:
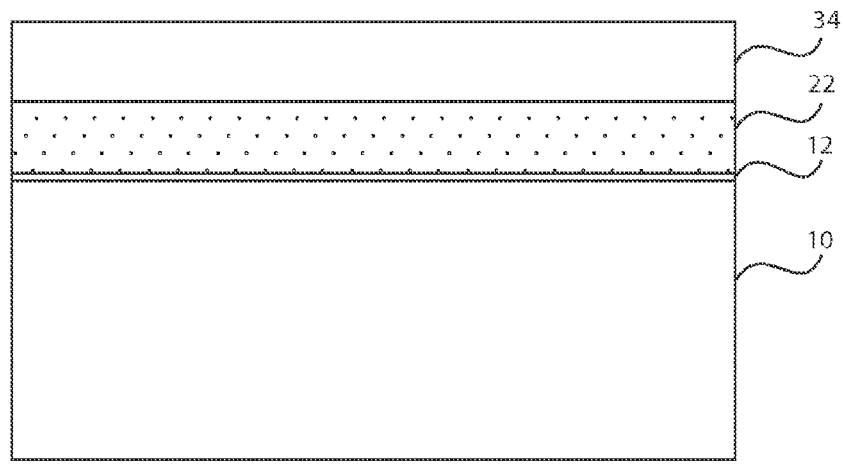
FIG. 9 is a cross-sectional view showing a device prior to wafer bonding having the substrate (e.g., Si) removed and replaced with a gate conductor formed on the thermally grown gate dielectric for forming the gate stack in accordance with another embodiment.

Referring to FIG. 9, in another embodiment, the layer 20 may be removed in FIG. 6 down to the dielectric layer 22. Then, a desired material 34 for the gate conductor of the stack 30 may be deposited. The desired material 34 may include a metal, such as copper, tungsten, titanium, aluminum, etc., doped polysilicon, organic conductors or other suitable conductive material or combination of materials. Processing would continue with FIG. 7 where the gate stack 30 is patterned.

Figure 10:
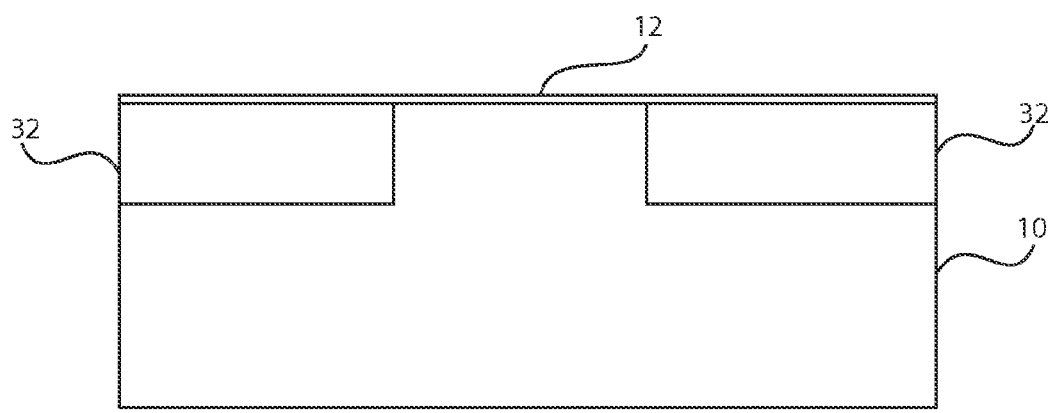
FIG. 10 is a cross-sectional view showing a device having source and drain regions formed prior to wafer bonding in accordance with another embodiment.

Referring to FIG. 10, in one embodiment, after FIG. 2, the S/D regions 32 may be formed in the substrate 10. This is performed prior to wafer bonding in FIG. 5. By forming S/D regions 32 at this early stage, high temperature doping processes are avoided after the gate stack 30 is formed.

Figure 11:
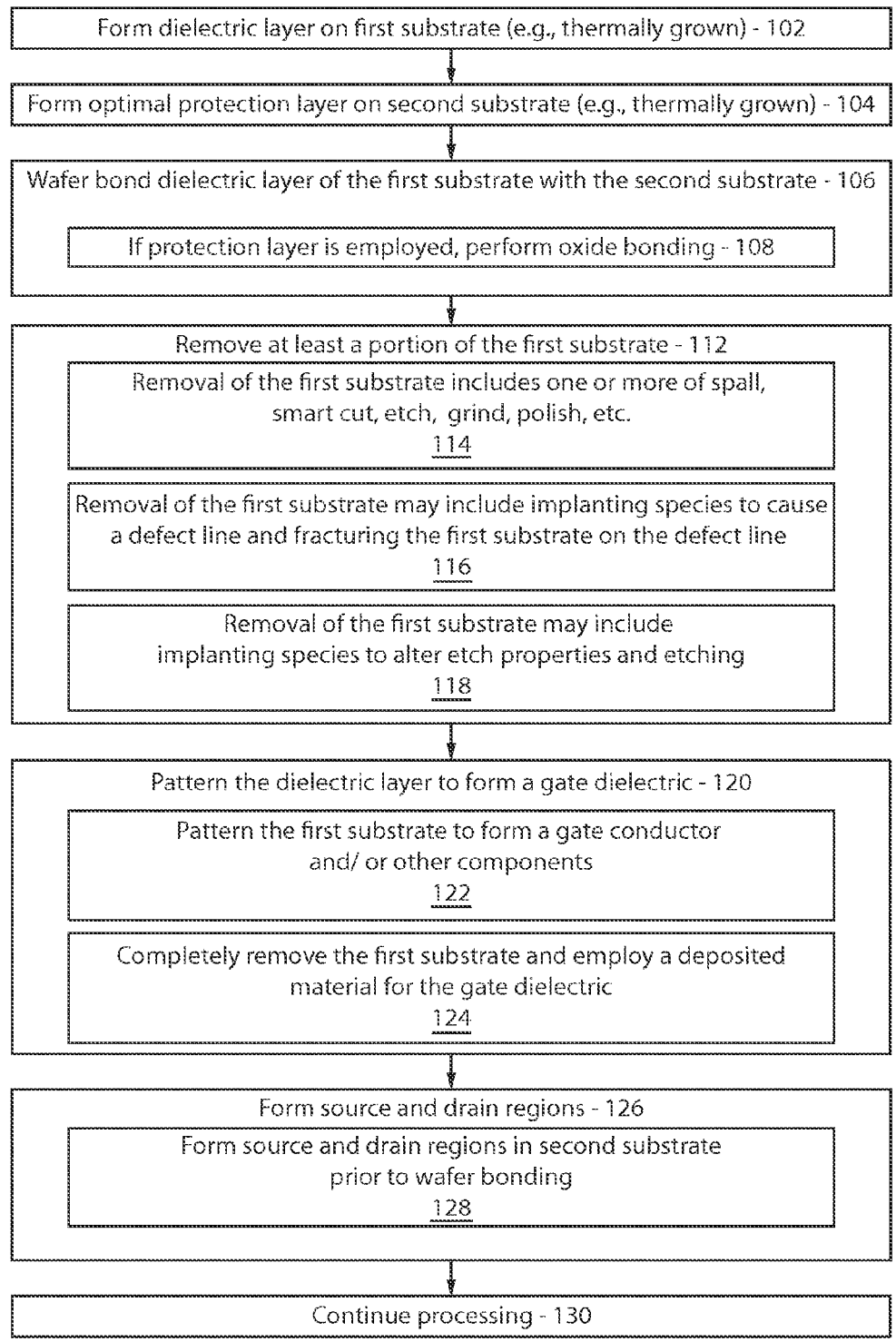
FIG. 11 is a block/flow diagram showing a method for forming a semiconductor device in accordance with illustrative embodiments.

Referring to FIG. 11, a method for forming a semiconductor device in accordance with exemplary embodiments is illustratively shown. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 102, a dielectric layer is formed on a first substrate. The first substrate preferably includes a material capable of growing a dielectric layer for use as a gate dielectric. The first substrate may include bulk silicon, a SOI substrate (with Si), SiGe, etc. and forming the dielectric layer preferably includes thermally growing an oxide on the first substrate. In block 104, a thin passivating layer may be formed on the second substrate. The passivating layer is preferably thermally grown. The second substrate material is difficult to form a thermally grown dielectric sufficient for use as a gate dielectric.

In block 106, the dielectric layer of the first substrate is wafer bonded to a second substrate formed from SiC or other substrate material where it is difficult to form a thermally grown dielectric to be employed for a gate dielectric. This may include wafer bonding the dielectric layer of the first substrate to the passivating layer of the second substrate. In block 108, if the passivating layer and the dielectric layer include oxides, the wafer bonding may include oxide bonding the passivating layer to the dielectric layer.

In block 112, at least a portion of the first substrate is removed from a side opposite the dielectric layer. The whole first substrate may be removed or a portion of its thickness may be removed. In block 114, removing at least a portion of the first substrate may include one or more smart cutting, spalling, grinding, and etching the first substrate. In block 116, removing at least a portion of the first substrate may include implanting dopant species into the first substrate to create a defect line and fracturing the first substrate along the defect line. In block 118, removing at least a portion of the first substrate may include implanting dopant species into the first substrate to change etching properties on a region and etching the first substrate selective to the region.

In block 120, the dielectric layer is patterned to form a gate dielectric for a field effect transistor formed on the second substrate. In block 122, patterning the dielectric layer to form a gate dielectric may include patterning the first substrate to form a gate conductor (e.g., to form a monocrystalline gate conductor) or other components. Portions of the first substrate may remain and may be patterned and employed to form electronic components, such as transistors or other circuitry. In block 124, patterning the dielectric layer to form a gate dielectric may include removing the first substrate and forming and patterning a gate conductor (e.g., metal or other material) on the dielectric layer.

In block 126, source and drain regions are formed. The source and drain regions may be formed in the second substrate prior to wafer bonding, in block 128. In block 130, processing continues to form devices, and in particular high power transistors.

Having described preferred embodiments for a transistor with bonded gate dielectric (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    oxidizing a first substrate, including a material other than SiC, wherein the oxidizing forms a dielectric layer;
    forming source and drain regions in a second substrate prior to wafer bonding;
    forming a passivating layer on the second substrate by oxidizing the second substrate;

wafer bonding the dielectric layer of the first substrate directly on the passivating layer of the second substrate, the second substrate including SiC with the passivating layer formed on the SiC;

removing at least a portion of the first substrate from a side opposite the dielectric layer; and patterning the dielectric layer to form a gate dielectric for a field effect transistor formed on the second substrate.

2. The method as recited in claim 1, wherein the first substrate includes silicon.

3. The method as recited in claim 1, wherein wafer bonding the dielectric layer of the first substrate to the second substrate includes bonding the dielectric layer to the passivating layer.

4. The method as recited in claim 3, wherein the passivating layer and the dielectric layer include oxides and the wafer bonding includes oxide bonding the passivating layer to the dielectric layer.

5. The method as recited in claim 1, further comprising forming electronic components in a remaining portion of the first substrate.

6. The method as recited in claim 1, wherein removing at least a portion of the first substrate includes at least one of: smart cutting, spalling, grinding, and etching the first substrate.

7. The method as recited in claim 1, wherein removing at least a portion of the first substrate includes implanting dopant species into the first substrate to create a defect line and fracturing the first substrate along the defect line.

8. The method as recited in claim 1, wherein removing at least a portion of the first substrate includes implanting dopant species into the first substrate to change etching properties on a region and etching the first substrate selective to the region.

9. The method as recited in claim 1, wherein patterning the dielectric layer to form the gate dielectric further includes patterning the first substrate to form a gate conductor.

10. The method as recited in claim 1, wherein patterning the dielectric layer to form the gate dielectric further includes removing the first substrate and forming and patterning a gate conductor on the dielectric layer.

11. A method for forming a semiconductor device, comprising:

oxidizing a first substrate, the first substrate including monocrystalline silicon and a material other than SiC, wherein the oxidizing forms a first dielectric layer;

implanting dopant species into the first substrate to form a defect line;

growing a dielectric passivating layer by oxidizing a second substrate formed from SiC;

forming source and drain regions in the second substrate prior to wafer bonding;

wafer bonding the first dielectric layer of the first substrate directly on the passivating layer of the second substrate;

removing at least a portion of the first substrate from a side opposite the first dielectric layer along the defect line; and patterning the first dielectric layer to form a gate dielectric for a field effect transistor formed on the second substrate.

12. The method as recited in claim 11, further comprising forming electronic components in a remaining portion of the first substrate.

13. The method as recited in claim 11, wherein removing at least a portion of the first substrate includes at least one of: smart cutting, spalling, grinding, and etching the first substrate.

14. The method as recited in claim 11, wherein patterning the first dielectric layer to form the gate dielectric further includes patterning the first substrate to form a gate conductor.

15. The method as recited in claim 11, wherein patterning the dielectric layer to form the gate dielectric further includes removing the first substrate and forming and patterning a gate conductor on the dielectric layer.

16. The method as recited in claim 11, wherein the passivating layer and the first dielectric layer include oxides and the wafer bonding includes oxide bonding the passivating layer to the first dielectric layer.

17. The method as recited in claim 11, wherein removing at least a portion of the first substrate includes implanting dopant species into the first substrate to change etching properties on a region and etching the first substrate selective to the region.

* * * * *